(12) United States Patent
Tong et al.

(10) Patent No.: US 8,916,958 B2
(45) Date of Patent: Dec. 23, 2014

(54) SEMICONDUCTOR PACKAGE WITH MULTIPLE CHIPS AND SUBSTRATE IN METAL CAP

(75) Inventors: Chong Yee Tong, Melaka (MY); Hui Teng Wang, Muar (MY)

(73) Assignee: Infineon Technologies AG, Neubiberg (DE)

( * ) Notice: Subject to any disclaimer, the term of this patent is extended or adjusted under 35 U.S.C. 154(b) by 1022 days.

(21) Appl. No.: 12/429,541

(22) Filed: Apr. 24, 2009

(65) Prior Publication Data
US 2010/0270667 A1   Oct. 28, 2010

(51) Int. Cl.
*H01L 23/02* (2006.01)
*H01L 23/055* (2006.01)
*H01L 25/065* (2006.01)
*H01L 23/20* (2006.01)
H01L 23/498 (2006.01)
H01L 23/00 (2006.01)

(52) U.S. Cl.
CPC ........... *H01L 23/055* (2013.01); H01L 2224/16 (2013.01); H01L 2924/01029 (2013.01); H01L 2225/06572 (2013.01); H01L 2924/01079 (2013.01); H01L 2224/45144 (2013.01); H01L 23/49827 (2013.01); *H01L 25/0652* (2013.01); H01L 2924/16172 (2013.01); H01L 2924/19107 (2013.01); H01L 2224/48091 (2013.01); H01L 2224/16225 (2013.01); H01L 2224/48465 (2013.01); *H01L 25/0657* (2013.01); H01L 2924/16152 (2013.01); *H01L 23/20* (2013.01); H01L 24/48 (2013.01); H01L 2224/73253 (2013.01); H01L 2924/01068 (2013.01); H01L 2225/0651 (2013.01); H01L 2924/16747 (2013.01); H01L 2225/06517 (2013.01); H01L 2924/15311 (2013.01)
USPC ............................ 257/686; 257/777; 257/778

(58) Field of Classification Search
USPC ................... 257/685, 686, 777, 778
See application file for complete search history.

(56) References Cited

U.S. PATENT DOCUMENTS

| | | | | |
|---|---|---|---|---|
| 5,821,161 | A * | 10/1998 | Covell et al. | 438/613 |
| 6,014,313 | A | 1/2000 | Hesselbom | |
| 6,111,314 | A | 8/2000 | Edwards et al. | |
| 6,538,319 | B2 * | 3/2003 | Terui | 257/704 |
| 6,849,940 | B1 * | 2/2005 | Chan et al. | 257/706 |
| 6,995,463 | B1 * | 2/2006 | Sutardja | 257/686 |
| 2002/0014689 | A1 | 2/2002 | Lo et al. | |
| 2002/0090753 | A1 | 7/2002 | Pai et al. | |
| 2002/0149098 | A1 | 10/2002 | Seyama et al. | |
| 2003/0020151 | A1 | 1/2003 | Chen et al. | |
| 2003/0141583 | A1 * | 7/2003 | Yang | 257/686 |
| 2004/0061213 | A1 * | 4/2004 | Karnezos | 257/686 |
| 2004/0212069 | A1 | 10/2004 | Chen et al. | |
| 2006/0170091 | A1 * | 8/2006 | Karnezos | 257/686 |
| 2006/0208358 | A1 | 9/2006 | Henttonen | |
| 2007/0176275 | A1 | 8/2007 | Singleton et al. | |
| 2008/0001277 | A1 | 1/2008 | Wen et al. | |

FOREIGN PATENT DOCUMENTS

| | | |
|---|---|---|
| EP | 1548827 A1 | 6/2005 |
| WO | 2005122250 A2 | 12/2005 |

* cited by examiner

Primary Examiner — Mark Tornow (57) ABSTRACT

A semiconductor package includes a first semiconductor chip, a second semiconductor chip, a first substrate, a second substrate and a metal cap. The chips are electrically connected to the first substrate, the second substrate is disposed between the chips, and the chips and the second substrate are disposed within the metal cap.

15 Claims, 10 Drawing Sheets

SEMICONDUCTOR PACKAGE WITH MULTIPLE CHIPS AND SUBSTRATE IN METAL CAP

FIELD OF THE INVENTION

The present invention generally relates to a semiconductor package, and more particularly to a semiconductor package that includes multiple chips, a substrate and a metal cap.

BACKGROUND OF THE INVENTION

Semiconductor chips include contact pads that are electrically connected to external circuitry in order to function as part of an electronic system. The external circuitry is typically a lead array such as lead frame or a support substrate such as a printed circuit board. Electrical connection between the chip and the external circuitry is often achieved by wire bonding, tape automated bonding (TAB) or flip-chip bonding. For instance, with flip-chip bonding, ball grid array (BGA) packages contain an array of solder balls to mount on corresponding terminals on a printed circuit board, and land grid array (LGA) packages contain an array of metal pads that receive corresponding solder traces mounted on corresponding terminals on a printed circuit board.

Semiconductor packages may include a single chip or multiple chips. For instance, a semiconductor package may include stacked chips to increase packaging density. The stacked chips are typically attached to one another by an adhesive, mounted on a substrate and wire bonded to the substrate. The stacked chips can be disposed within a metal cap mounted on the substrate to improve heat dissipation. The chip at the top of the stack may have good heat dissipation through the metal cap. However, the chip at the bottom of the stack may have poor heat dissipation since it is thermally isolated from the metal cap, leading to reliability problems.

Therefore, there is a need for a semiconductor package with multiple chips that is compact and has excellent thermal and electrical performance.

SUMMARY

The present invention provides a semiconductor package that includes a first semiconductor chip, a second semiconductor chip, a first substrate, a second substrate and a metal cap. The chips are electrically connected to the first substrate, the second substrate is disposed between the chips, and the chips and the second substrate are disposed within the metal cap.

The present invention also provides a method of manufacturing a semiconductor package that includes providing a first semiconductor chip, a second semiconductor chip, a first substrate, a second substrate and a metal cap, disposing the second substrate between the chips, disposing the chips and the second substrate within the metal cap, attaching the first chip to the first substrate, attaching the second chip to the metal cap, attaching the chips to the second substrate, attaching the metal cap to the first substrate, and electrically connecting the chips to the first substrate.

These and other features and advantages of the present invention will become more apparent in view of the detailed description that follows.

BRIEF DESCRIPTION OF THE DRAWINGS

Embodiments are now more fully described with reference to the drawings in which.

DETAILED DESCRIPTION OF THE INVENTION

In the following description, embodiments of the present invention are described. It shall be apparent to those skilled in the art, however, that the present invention may be practiced without such details. Some details are omitted to clarify the present invention.

Figure 1:
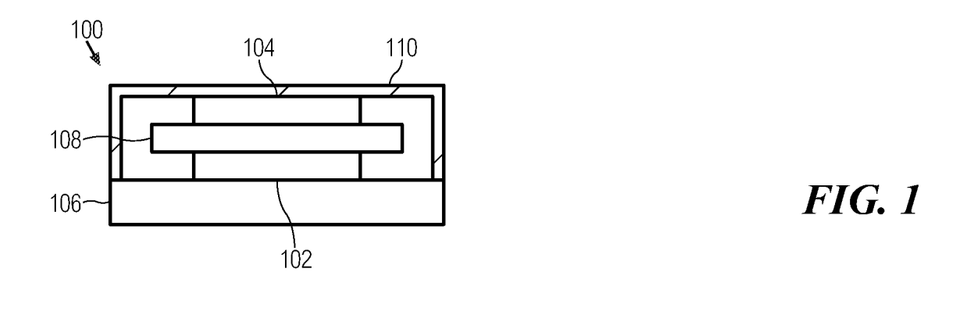
FIG. 1 is a cross-sectional view of a semiconductor package in accordance with a first embodiment.

FIG. 1 is a cross-sectional view of semiconductor package 100 in accordance with a first embodiment. Semiconductor package 100 includes first semiconductor chip 102, second semiconductor chip 104, first substrate 106, second substrate 108 and metal cap 110. Chips 102 and 104 are electrically connected to substrate 106, substrate 108 is disposed between chips 102 and 104, and chips 102 and 104 and substrate 108 are disposed within metal cap 110.

Figure 2A:
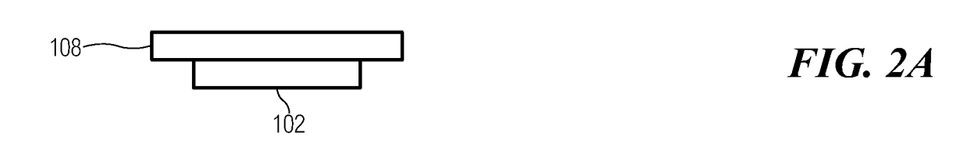
FIGS. 2A-2D are cross-sectional views of a method of making the semiconductor package of the first embodiment.
Figure 2B:
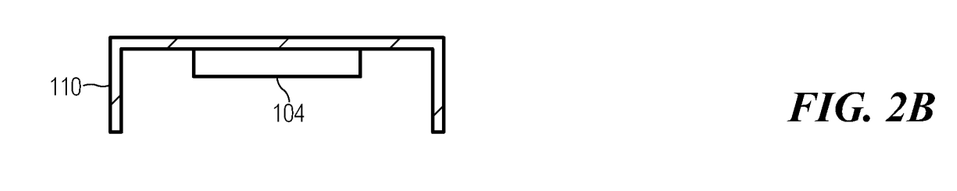
Figure 2C:
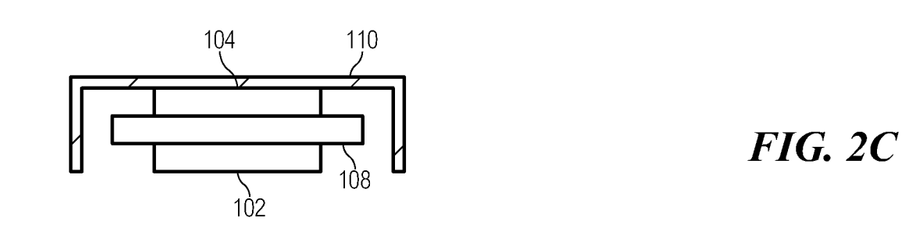
Figure 2D:
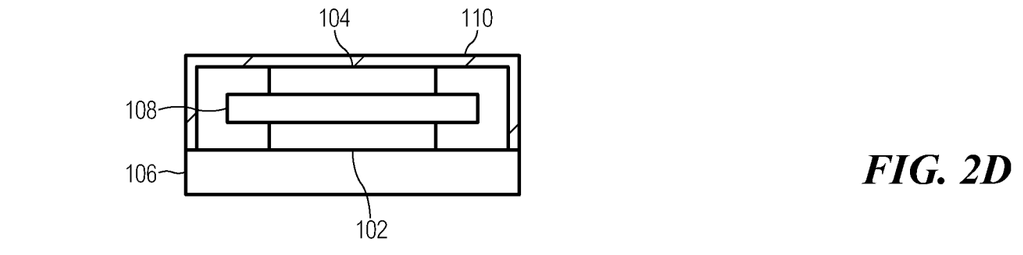

FIGS. 2A-2D are cross-sectional views of a method of making semiconductor package 100. In FIG. 2A, chip 102 is attached and electrically connected to substrate 108. In FIG. 2B, chip 104 is attached to metal cap 110. In FIG. 2C, chip 104 is attached to substrate 108, thereby disposing chips 102 and 104 and substrate 108 within metal cap 110 and disposing substrate 108 between chips 102 and 104. In FIG. 2D, chip 102 and metal cap 110 are attached to substrate 106 and chips 102 and 104 are electrically connected to substrate 106.

Semiconductor package 100 can be assembled in numerous manufacturing sequences. FIGS. 2A-2D illustrate one such manufacturing sequence. The present invention includes many other manufacturing sequences as illustrated below.

Chip 102 can be attached to substrate 108 (FIG. 2A) before, during or after chip 104 is attached to metal cap 110 (FIG. 2B), then chip 104 can be attached to substrate 108 (FIG. 2C), and then chip 102 and metal cap 110 can be attached to substrate 106 (FIG. 2D).

Chips 102 and 104 can be attached to substrate 108, then chip 102 can be attached to substrate 106, and then chip 104 and substrate 106 can be attached to metal cap 110. For example, chip 102 can be attached to substrate 108, then chip 104 can be attached to substrate 108, then chip 102 can be attached to substrate 106, and then chip 104 and substrate 106 can be attached to metal cap 110. As another example, chip 104 can be attached to substrate 108, then chip 102 can be attached to substrate 108, then chip 102 can be attached to substrate 106, and then chip 104 and substrate 106 can be attached to metal cap 110.

Chips 102 and 104 can be attached to substrate 108, then chip 104 can be attached to metal cap 110, and then chip 102 and metal cap 110 can be attached to substrate 106. For example, chip 102 can be attached to substrate 108, then chip 104 can be attached to substrate 108, then chip 104 can be attached to metal cap 110, and then chip 102 and metal cap 110 can be attached to substrate 106. As another example, chip 104 can be attached to substrate 108, then chip 102 can be attached to substrate 108, then chip 104 can be attached to metal cap 110, and then chip 102 and metal cap 110 can be attached to substrate 106.

Chip 102 can be attached to substrate 106, then chip 104 and substrate 108 can be attached to chip 102, and then chip 104 and substrate 106 can be attached to metal cap 110. For example, chip 102 can be attached to substrate 106 and chip 104 can be attached to substrate 108, then substrate 108 can be attached to chip 102, and then chip 104 and substrate 106 can be attached to metal cap 110. As another example, chip 102 can be attached to substrate 106, then substrate 108 can be attached to chip 102, then chip 104 can be attached to substrate 108, and then chip 104 and substrate 106 can be attached to metal cap 110.

Chip 104 can be attached to metal cap 110, then chip 102 and substrate 108 can be attached to chip 104, and then chip 102 and metal cap 110 can be attached to substrate 106. For example, chip 102 can be attached to substrate 106 and chip 104 can be attached to metal cap 110, then substrate 108 can be attached to chip 102, and then chip 104 and substrate 106 can be attached to metal cap 110. As another example, chip 102 can be attached to substrate 106, then substrate 108 can be attached to chip 102, then chip 104 can be attached to substrate 108, and then chip 104 and substrate 106 can be attached to metal cap 110.

Figure 3A:
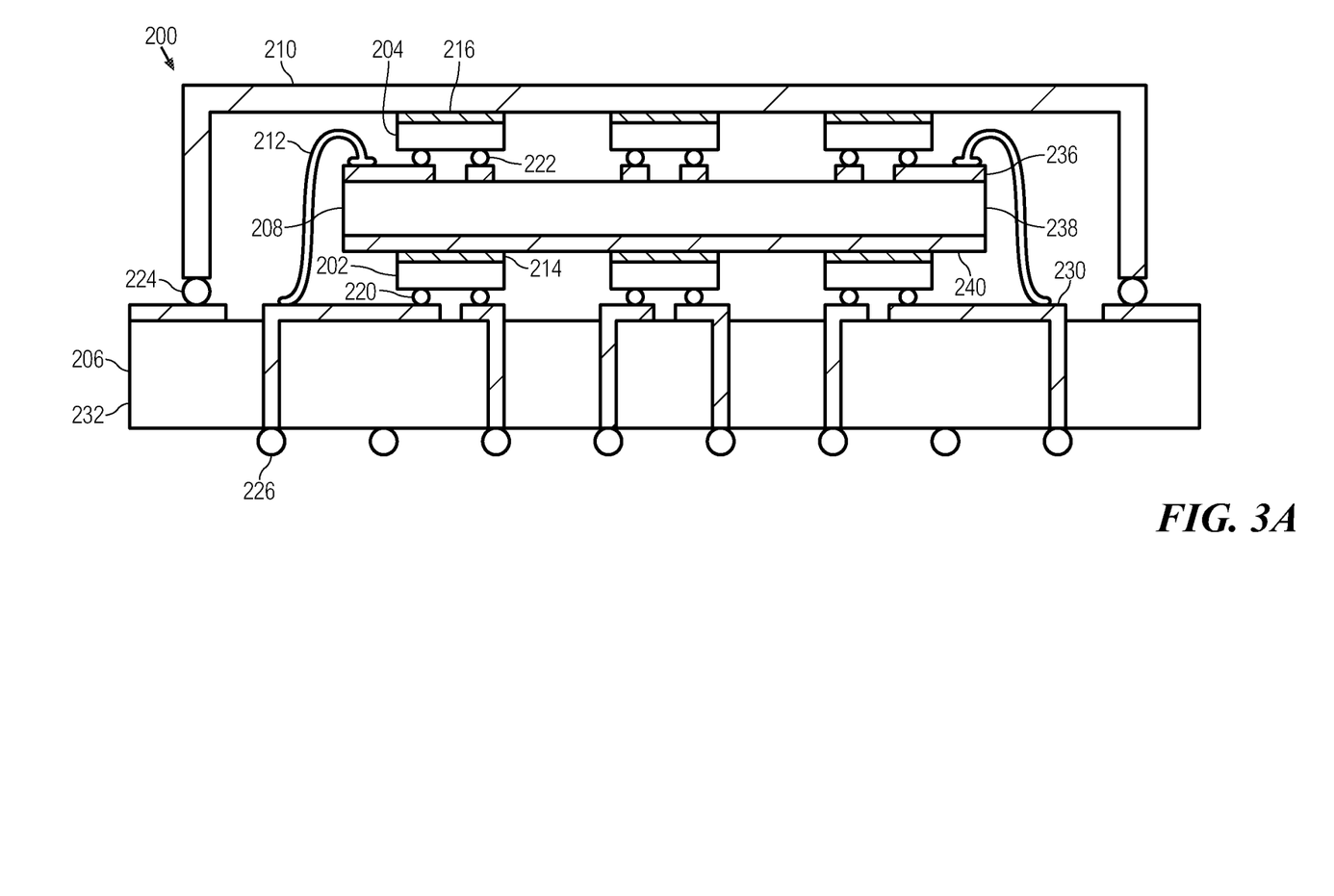
FIGS. 3A, 3B and 3C are cross-sectional, top and bottom views, respectively, of a semiconductor package in accordance with a second embodiment.
Figure 3B:
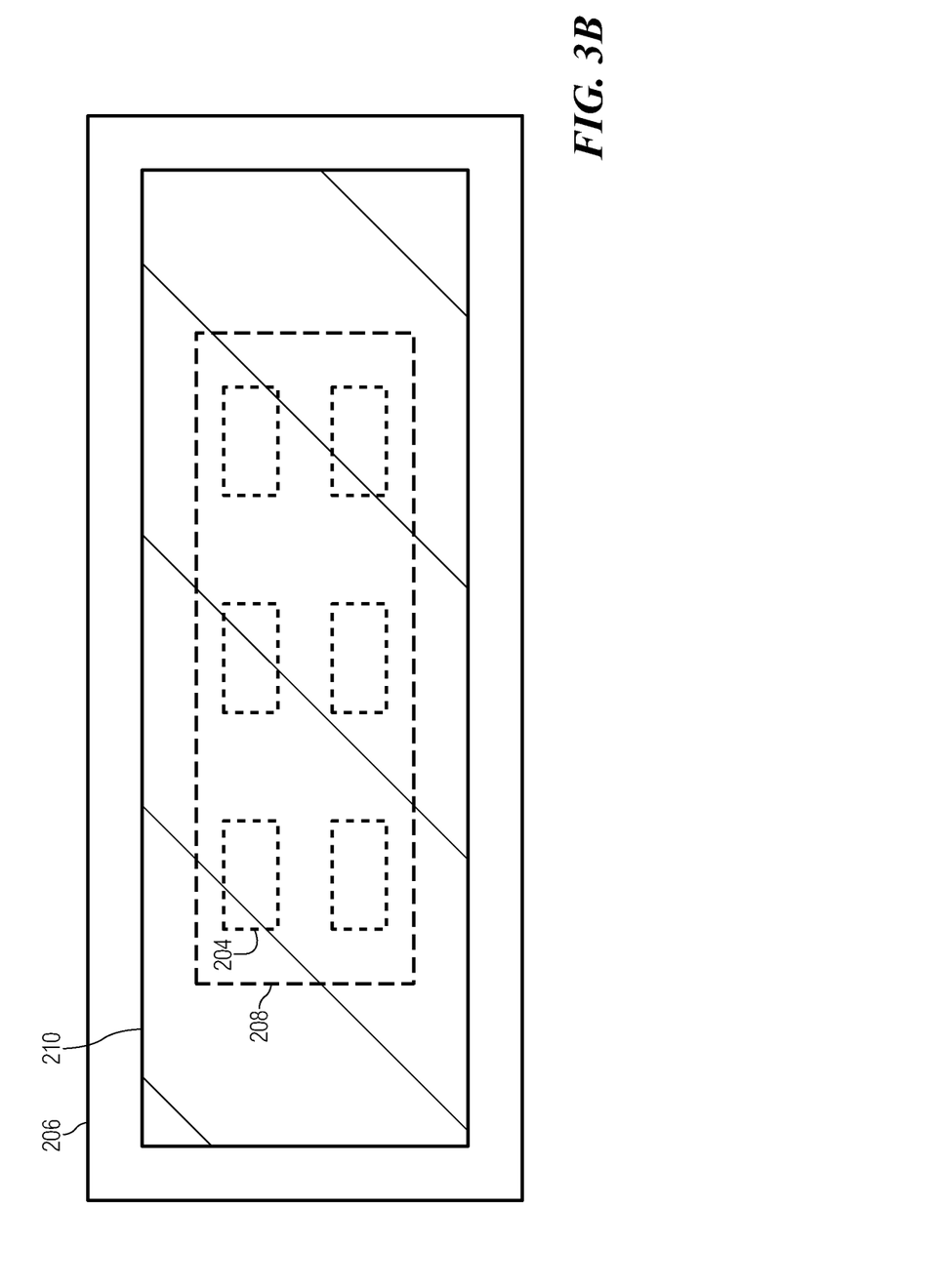
Figure 3C:
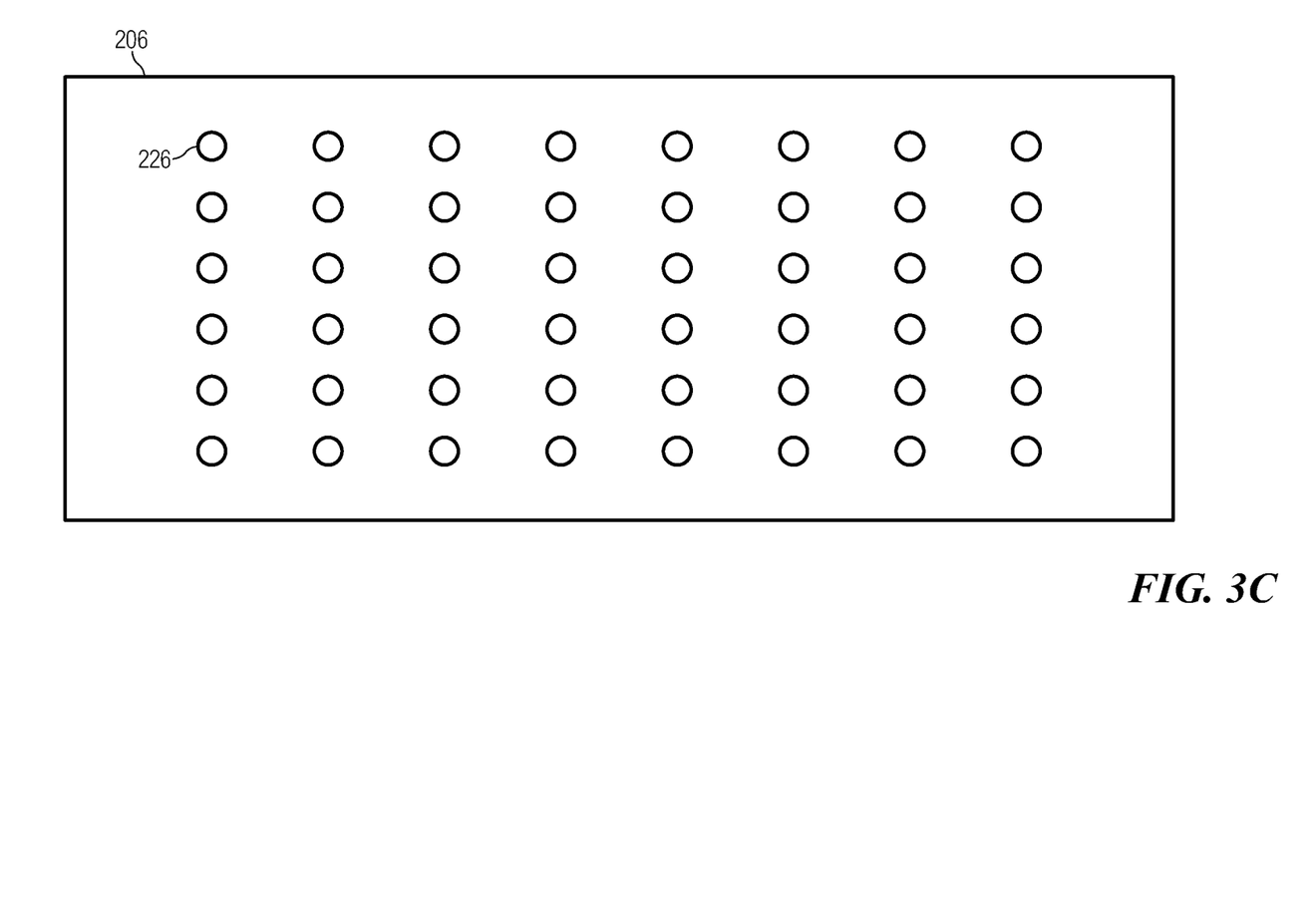

FIGS. 3A, 3B and 3C are cross-sectional, top and bottom views, respectively, of semiconductor package 200 in accordance with a second embodiment.

Semiconductor package 200 includes first semiconductor chips 202, second semiconductor chips 204, first substrate 206, second substrate 208, metal cap 210, wire bonds 212, first thermally conductive adhesives 214, second thermally conductive adhesives 216, first solder balls 220, second solder balls 222, third solder balls 224 and fourth solder balls 226. Substrate 206 includes conductive traces 230 and insulative layer 232. Substrate 208 includes conductive traces 236, insulative layer 238 and conductive layer 240.

Chips 202 are arranged in a 2×3 array and chips 204 are arranged in a 2×3 array. Furthermore, chips 202 are vertically aligned with corresponding chips 204 in a stacked arrangement.

Substrate 206 is disposed beneath and provides a mounting base for the other components. Conductive traces 230 are copper and insulative layer 232 is plastic. Conductive traces 230 can be flash plated with gold to improve solder wettability. Conductive traces 230 extend vertically through insulative layer 232 between the top and bottom surfaces of insulative layer 232.

Substrate 208 is disposed between chips 202 and 204. Conductive traces 236 are copper, insulative layer 238 is ceramic and conductive layer 240 is copper. Conductive traces 236 can be flash plated with gold to improve solder wettability. Conductive traces 236 are located on the top surface of insulative layer 238, and conductive layer 240 is located on the bottom surface of insulative layer 238. Furthermore, conductive traces 236 do not extend through insulative layer 238. Instead, conductive traces 236 and conductive layer 240 are electrically insulated from one another but thermally connected to one another by insulative layer 238.

Metal cap 210 is mounted on substrate 206. Metal cap 210 is copper coated with silver to prevent oxidation and has high thermal conductivity.

Wire bonds 212 contact and electrically connect substrate 206 (at conductive traces 230) and substrate 208 (at conductive traces 236). Wire bonds 212 are gold wires that are welded to conductive traces 230 and 236.

Thermally conductive adhesives 214 contact and are sandwiched between and mechanically attach and thermally connect corresponding chips 202 (at the backside) to substrate 208 (at conductive layer 240). Thermally conductive adhesives 214 are gold/tin alloy with high thermal conductivity.

Thermally conductive adhesives 216 contact and are sandwiched between and mechanically attach and thermally connect corresponding chips 204 (at the backside) to metal cap 210 (at the inside bottom major surface). Thermally conductive adhesives 216 are gold/tin alloy with high thermal conductivity.

Solder balls 220 contact and are sandwiched between and mechanically attach and electrically and thermally connect corresponding chips 202 (at the active surface) to substrate 206 (at conductive traces 230).

Solder balls 222 contact and are sandwiched between and mechanically attach and electrically and thermally connect corresponding chips 204 (at the active surface) to substrate 208 (at conductive traces 236).

Solder balls 224 contact and are sandwiched between and mechanically attach substrate 206 and metal cap 210.

Solder balls 226 contact and are electrically connected to conductive traces 230 (at the bottom surface of substrate 206) and protrude downwardly from substrate 206 at its bottom surface.

Substrate 206 and metal cap 210 form a sealed enclosure with an air-filled cavity. Chips 202 and 204, substrate 208, wire bonds 212, thermally conductive adhesives 214 and 216 and solder balls 220, 222 and 224 are disposed within metal cap 210 and thus sealed within the enclosure. Likewise, conductive traces 236 at the top surface of insulative layer 238 are within metal cap 210 and sealed within the enclosure. However, substrate 206 (below its top surface) and solder balls 226 are disposed outside metal cap 210 and the enclosure.

Chips 202 and 204, substrates 206 and 208, metal cap 210 and thermally conductive adhesives 214 and 216 all include top and bottom opposing major surfaces that face in opposite vertical directions, are parallel to one another and are orthogonal to the vertical (upward and downward) directions. For instance, chips 202 and 204 include top surfaces (with active circuitry) that face downwards (since chips 204 and 204 are inverted) and bottom surfaces (at the backside) that face upwards (since chips 202 and 204 are inverted). Substrate 206 includes a top surface that faces upwards (within the sealed enclosure) and a bottom surface that faces downwards (at solder balls 226). Substrate 208 includes a top surface that faces upwards (at conductive traces 236) and a bottom surface that faces downwards (at conductive layer 240). Metal cap 210 includes a top surface that faces upwards (and is exposed) and a bottom surface that faces downwards (within the sealed enclosure). Thermally conductive adhesives 214 include top surfaces that faces upwards (and contact conductive layer 240) and bottom surfaces that face downwards (and contact chips 202). Thermally conductive adhesives 216 include top surfaces that faces upwards (and contact metal cap 210) and bottom surfaces that face downwards (and contact chips 204).

Chips 202 are electrically connected to solder balls 226 by solder balls 220 and conductive traces 230. Chips 204 are electrically connected to solder balls 226 by wire bonds 212, solder balls 222 and conductive traces 230 and 236. Thus, chips 202 are electrically connected to solder balls 226 without using substrate 208 or wire bonds 212, whereas chips 204 are electrically connected to solder balls 226 using substrate 208 and wire bonds 212.

Chips 202 are thermally connected to substrate 206 by solder balls 220 as well as air convection due to their close vertical proximity to substrate 206. Chips 202 are also thermally connected to metal cap 210 by substrate 208 (at conductive layer 240) and thermally conductive adhesives 214 since substrate 208 (at conductive layer 240) is thermally connected to metal cap 210 by air convection due to its close horizontal proximity to metal cap 210. Thus, substrate 208 provides not only electrical routing for chips 204, but also heat dissipation for chips 202. Chips 204 are thermally connected to metal cap 210 by thermally conductive adhesives 216.

FIGS. 4A-4J are cross-sectional views of a method of making semiconductor package 200.

Figure 4A:
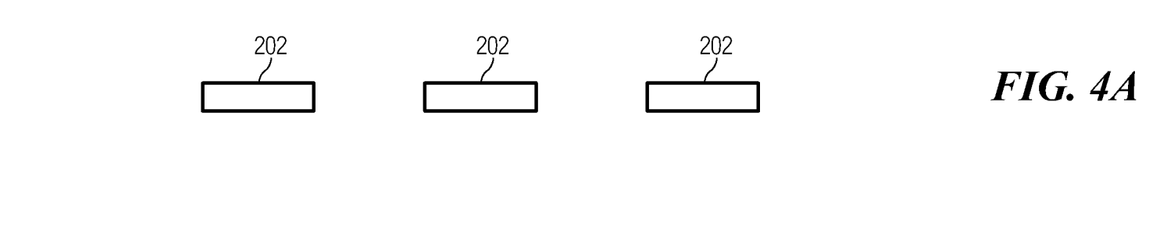
FIGS. 4A-4J are cross-sectional views of a method of making the semiconductor package of the second embodiment.
Figure 4B:
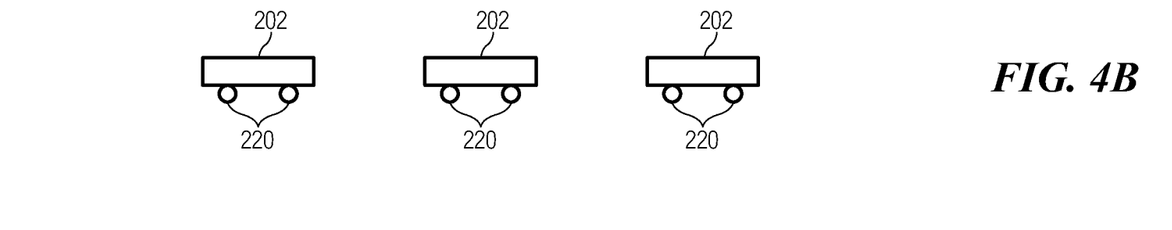
Figure 4C:
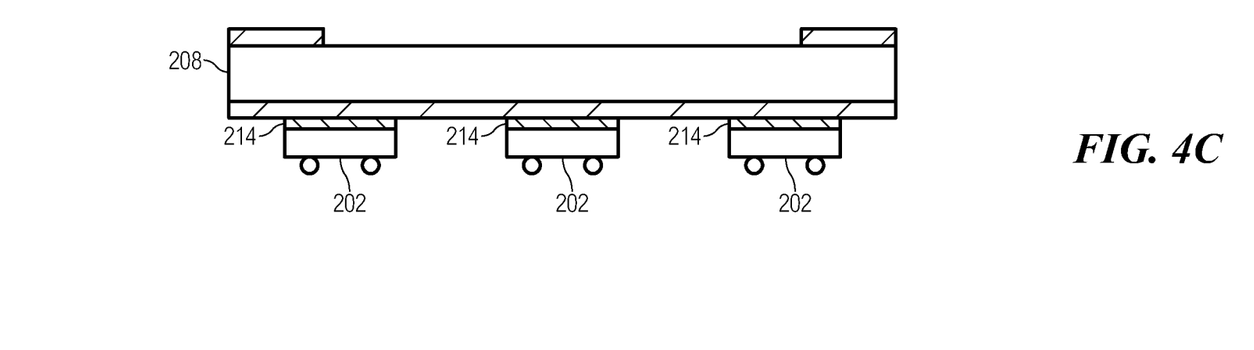
Figure 4D:
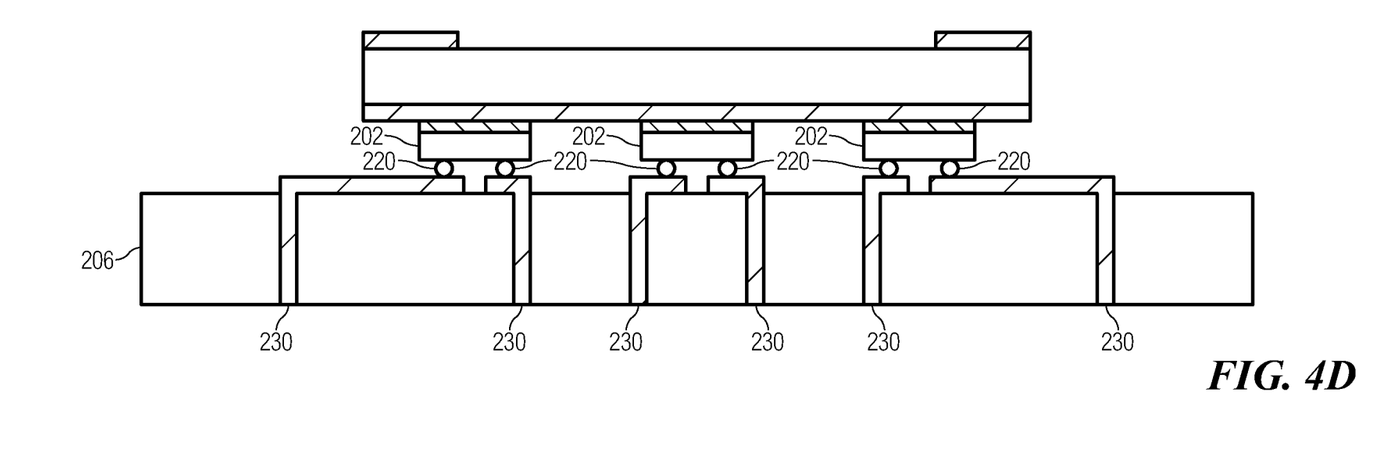
Figure 4E:
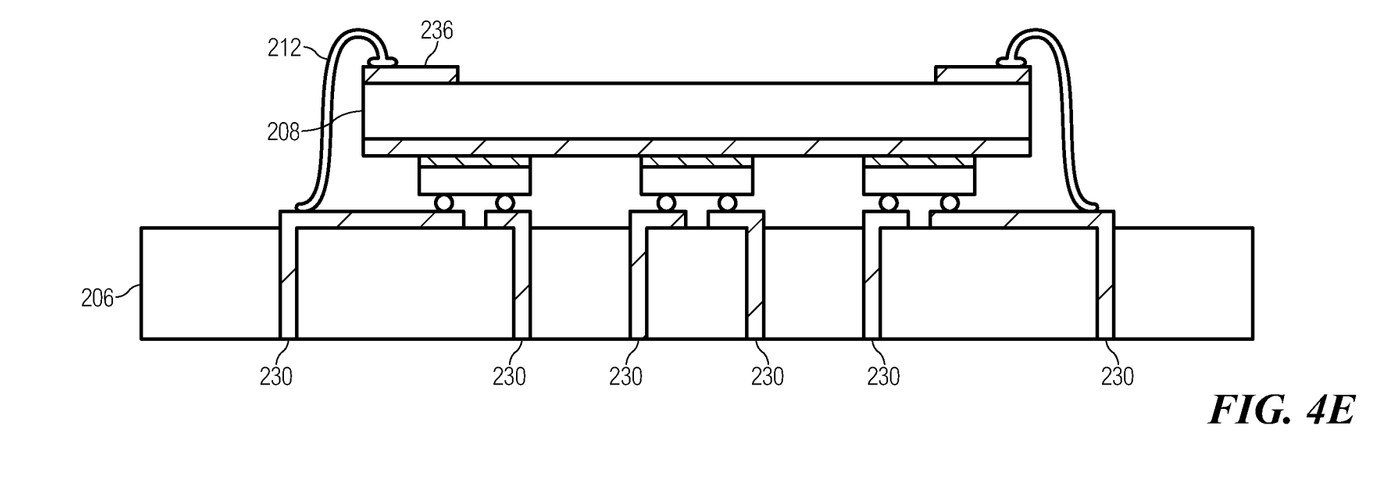

In FIG. 4A, chips 202 are provided. In FIG. 4B, solder balls 220 are attached to chips 202 at contact pads (not shown). In FIG. 4C, chips 202 are mechanically attached and thermally connected to substrate 208 by thermally conductive adhesives 214. In FIG. 4D, chips 202 are mounted on substrate 206 such that solder balls 220 contact and are sandwiched between chips 202 and conductive traces 230, and then solder balls 220 are heated, reflowed and hardened to form solder joints that mechanically attach and electrically connect chips 202 to substrate 206. In FIG. 4E, wire bonds 212 are welded to conductive traces 230 and 236 to electrically connect substrates 206 and 208.

Figure 4F:
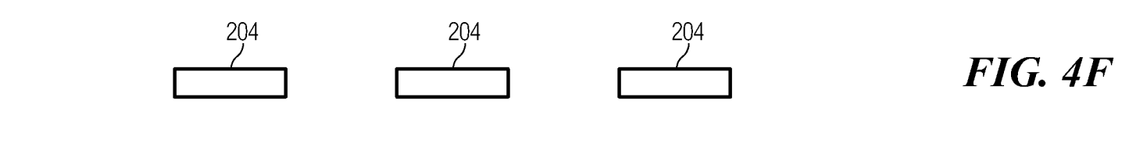
Figure 4G:
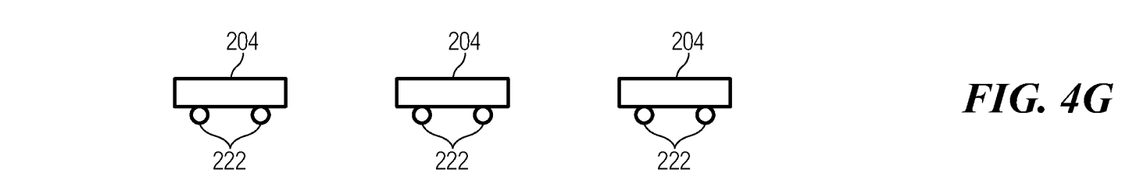
Figure 4H:
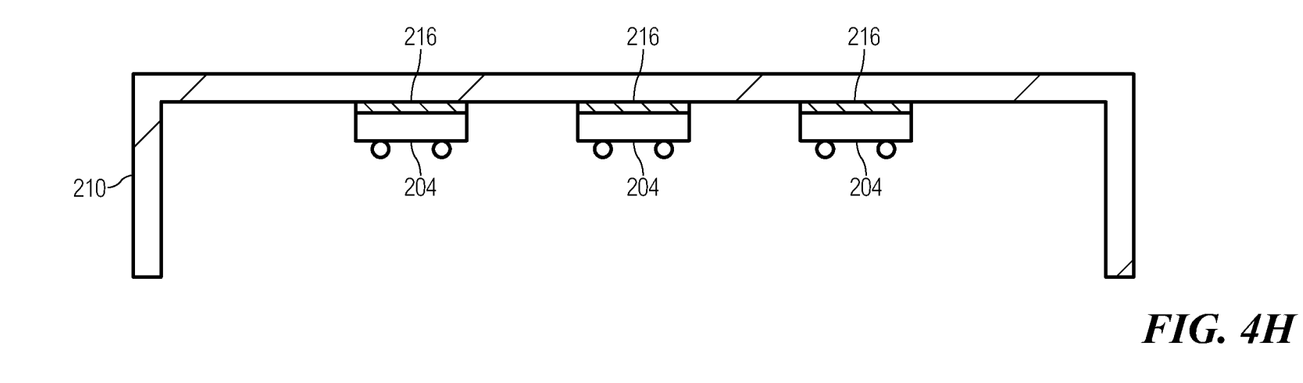

In FIG. 4F, chips 204 are provided. In FIG. 4G, solder balls 222 are attached to chips 204 at contact pads (not shown). In FIG. 4H, chips 204 are mechanically attached and thermally connected to metal cap 210 by thermally conductive adhesives 216.

Figure 4I:
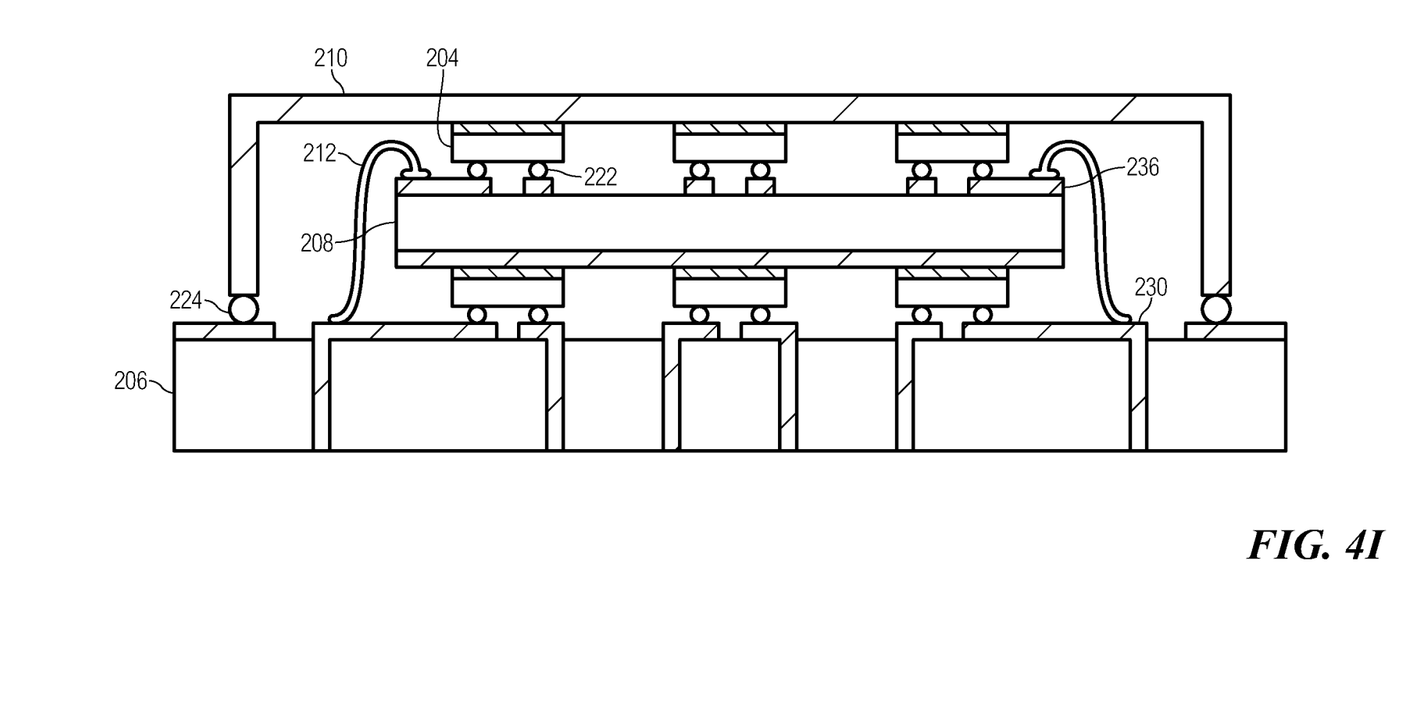
Figure 4J:
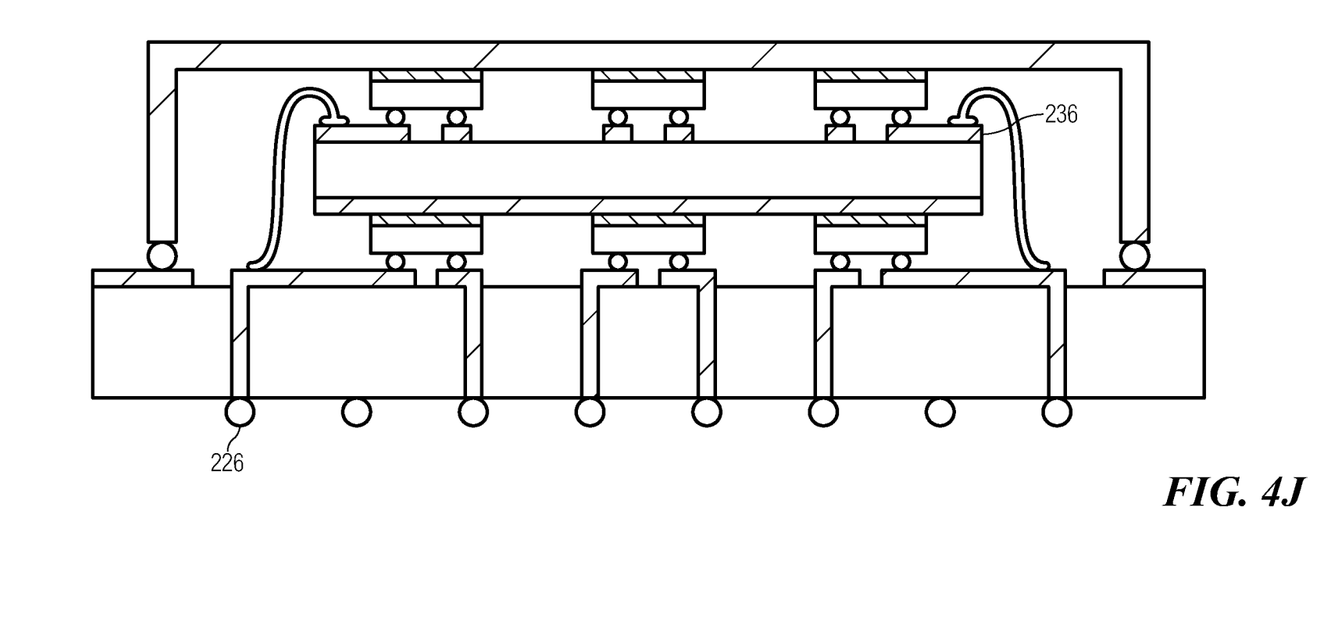

In FIG. 4I, chips 204 are mounted on substrate 208 and metal cap 210 is mounted on substrate 206 such that solder balls 222 contact and are sandwiched between chips 204 (at the contact pads) and substrate 208 (at conductive traces 236), and solder balls 224 contact and are sandwiched between substrate 206 and metal cap 210. Thereafter, solder balls 222 and 224 are simultaneously heated, reflowed and hardened to form solder joints that mechanically attach and electrically connect chips 204 to substrate 208 and that mechanically attach substrate 206 to metal cap 210. Furthermore, chips 204 are electrically connected to substrate 206 by wire bonds 212, solder balls 222 and conductive traces 230. In FIG. 4J, solder balls 226 are attached to conductive traces 236.

Semiconductor package 200 can be assembled in numerous manufacturing sequences. FIGS. 4A-4J illustrate one such manufacturing sequence. The present invention includes many other manufacturing sequences as illustrated below.

The steps in FIGS. 4A-4E may be performed before, during or after the steps in FIGS. 4F-4H. Likewise, chips 202 and 204, substrates 206 and 208 and metal cap 210 can be assembled using wire bonds 212, thermally conductive adhesives 214 and 216 and solder balls 220, 222 and 224 to provide package 200 with the various manufacturing sequences illustrated above for chips 102 and 104, substrates 106 and 108 and metal cap 110.

The above description and examples illustrate embodiments of the present invention, and it will be appreciated that various modifications and improvements can be made without departing from the scope of the present invention.

The invention claimed is:

1. A semiconductor package, comprising:
a set of first semiconductor chips arranged in a first array;
a set of second semiconductor chips arranged in a second array having the same dimensions as the first array;
a first substrate;
a second substrate; and
a metal cap, wherein the first semiconductor chips and the second semiconductor chips are electrically connected to the first substrate, the second substrate is disposed between the first semiconductor chips and the second semiconductor chips, wherein the second substrate comprises an insulating layer and a thermally conductive layer on a side of the second substrate facing the first semiconductor chips, and the first semiconductor chips and the second semiconductor chips and the second substrate are disposed within and sealed within a gas-filled cavity,
wherein the first semiconductor chips are vertically aligned with the second semiconductor chips,
wherein the second semiconductor disposed on and electrically connected to one or more conductive traces disposed directly on the second substrate, and wherein the first semiconductor chips are disposed on and electrically connected to one or more conductive traces disposed directly on the first substrate;
one or more wire bonds extending from the one or more conductive traces disposed on the first substrate to the one or more conductive traces on the second substrate so as to electrically connect one or more of the first second semiconductor chips to a corresponding vertically aligned one of the second semiconductor chips;
wherein the first substrate and the metal cap form a sealed enclosure with the gas-filled cavity,
wherein heat from the first chip is dissipated to the metal cap by air convection via the second substrate.

2. The semiconductor package of claim 1, including a thermally conductive adhesive that contacts and is sandwiched between and mechanically attaches and thermally connects the second semiconductor chip and the metal cap.

3. The semiconductor package of claim 1, including solder balls that contact and are sandwiched between and mechanically attach and electrically connect the second semiconductor chip and the second substrate.

4. The semiconductor package of claim 1, including a thermally conductive adhesive that contacts and is sandwiched between and mechanically attaches and thermally connects the first semiconductor chip and the second substrate.

5. The semiconductor package of claim 1, including solder balls that contact and are sandwiched between and mechanically attach and electrically connect the first semiconductor chip and the first substrate.

6. A semiconductor package, comprising:
a set of first semiconductor chips arranged in a first array, each first semiconductor chip including first and second opposing major surfaces;
a set of second semiconductor chips arranged in a second array having the same dimensions as the first array, each second semiconductor chip including first and second opposing major surfaces;
a first substrate that includes first and second opposing major surfaces;
a second substrate that includes first and second opposing major surfaces; and a metal cap,
wherein first major surfaces of the first and second semiconductor chips and the first and second substrates face in a first direction, the second major surfaces of the first and second semiconductor chips and the first and second substrates face in a second direction opposite the first direction, the first semiconductor chips are electrically connected to the first substrate, the second semiconductor chips are electrically connected to the first substrate using the second substrate, the second substrate is disposed between the first and second semiconductor chips, the first semiconductor chips are thermally conductively connected with the second substrate, the first and second semiconductor chips and the second substrate are disposed within the metal cap, the metal cap is mounted on the first substrate, and the metal cap and the first substrate form an enclosure that seals the first and second semiconductor chips and the second substrate in a gas-filled cavity, wherein the first semiconductor chips are vertically aligned with the second semiconductor chips, wherein the second semiconductor chips are disposed on and electrically connected to one or more conductive traces disposed on the second substrate, and wherein the first semiconductor chips are disposed on and electrically connected to one or more conductive traces disposed on the first substrate;

one or more wire bonds electrically connecting one or more of the first second semiconductor chips to a corresponding vertically aligned one of the second semiconductor chips via the one or more conductive traces disposed on the first and the second substrate, wherein heat from the first chip is dissipated to the metal cap by air convection via the second substrate.

7. The semiconductor package of claim 6, including a first thermally conductive adhesive that contacts and is sandwiched between and mechanically attaches and thermally connects the first semiconductor chip and the second substrate, and a second thermally conductive adhesive that contacts and is sandwiched between and mechanically attaches and thermally connects the second semiconductor chip and the metal cap.

8. The semiconductor package of claim 6, including first solder balls that contact and are sandwiched between and mechanically attach and electrically connect the first semiconductor chip and the first substrate, and second solder balls that contact and are sandwiched between and mechanically attach and electrically connect the second semiconductor chip and the second substrate.

9. The semiconductor package of claim 6, including third solder balls that contact and are sandwiched between and mechanically attach the metal cap and the first substrate.

10. The semiconductor package of claim 6, including wire bonds that are welded to and electrically connect the substrates, thereby electrically connecting the second semiconductor chip to the first substrate using the second substrate and the wire bonds.

11. A semiconductor package, comprising:
a set of first semiconductor chips arranged in a first array;
a set of second semiconductor chips arranged in a second array having the same dimensions as the first array;
a first substrate;
a second substrate;
a metal cap;
first thermal connection thermally connecting the first semiconductor chips to the second substrate;
second thermal connection thermally connecting the second semiconductors chip to the metal cap;
first electrical connection electrically connecting the first semiconductor chip to the first substrate;
second electrical connection electrically connecting the second semiconductor chip to the second substrate;
third electrical connection electrically connecting the first substrate to the second substrate, thereby electrically connecting the first substrate to the second semiconductor chip; and
mechanical attachment mechanically attaching the metal cap to the first substrate;

wherein the first and second semiconductor chips, the second substrate, the first and second thermal connection and the second and third electrical connection are disposed within the metal cap, the first electrical connection extends within the metal cap, and the metal cap is mounted on the first substrate forming a gas-filled enclosure, wherein heat from the first chip is dissipated to the metal cap by air convection via the second substrate, wherein the first semiconductor chips are vertically aligned with the second semiconductor chips, wherein the second semiconductor chips are disposed on and electrically connected to one or more conductive traces disposed on the second substrate, and wherein the first semiconductor chips are disposed on and electrically connected to one or more conductive traces disposed on the first substrate;

one or more wire bonds electrically connecting one or more of the first second semiconductor chips to a corresponding vertically aligned one of the second semiconductor chips via the one or more conductive traces disposed on the first and the second substrate.

12. The semiconductor package of claim 11, wherein the first thermal connection is a thermally conductive adhesive that contacts and mechanically attaches and thermally connects the first semiconductor chips and the second substrate, and the second thermal connection is a thermally conductive adhesive that contacts and mechanically attaches and thermally connects the second semiconductor chips and the metal cap.

13. The semiconductor package of claim 11, wherein the first electrical connection is first solder balls that contact and are sandwiched between and mechanically attach and electrically connect the first semiconductor chips and the first substrate, the second electrical connection is second solder balls that contact and are sandwiched between and mechanically attach and electrically connect the second semiconductor chips and the second substrate, and the third electrical connection means are wire bonds that are welded to and electrically connect the substrates.

14. The semiconductor package of claim 13, wherein the mechanical attachment is third solder balls that contact and are sandwiched between and mechanically attach the metal cap and the first substrate.

15. The semiconductor package of claim 11, wherein the second substrate includes a first conductive layer that contacts the first thermal connection, a second conductive layer that contacts the first and third electrical connection, and an insulation layer that contacts and is sandwiched between the conductive layers.

* * * * *